Figure 1:
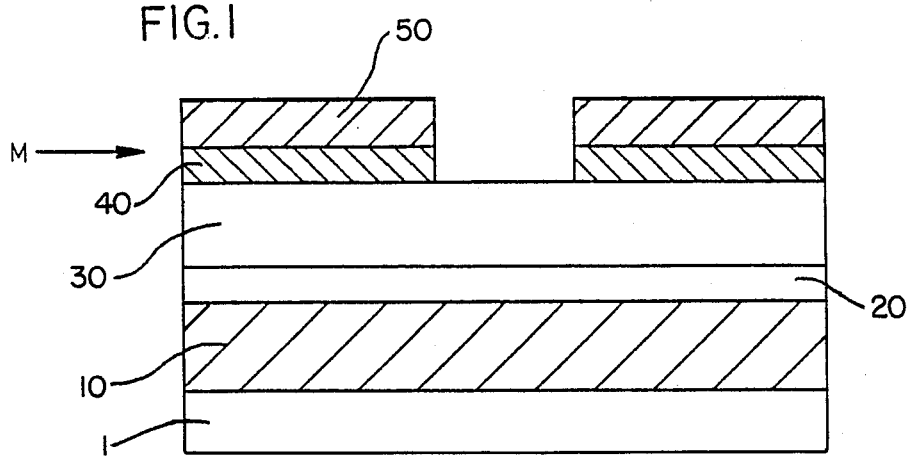

United States Patent [19]

Cote et al.

[11] Patent Number: 4,786,360
[45] Date of Patent: Nov. 22, 1988

[54] ANISOTROPIC ETCH PROCESS FOR TUNGSTEN METALLURGY

[75] Inventors: William J. Cote; Karey L. Holland, both of Essex Junction; Terrance M. Wright, Williston, all of Vt.

[73] Assignee: International Business Machines Corporation, Armonk, N.Y.

[21] Appl. No.: 31,813

[22] Filed: Mar. 30, 1987

[51] Int. Cl.$^4$ .............................................. B44C 1/22
[52] U.S. Cl. .............................. 156/643; 156/646; 156/664; 156/656; 156/667; 357/71
[58] Field of Search ............... 252/79.1; 156/643, 646, 156/664, 667, 656; 29/576 R, 578; 357/71

[56] References Cited

U.S. PATENT DOCUMENTS

| | | | |
|---|---|---|---|
| 3,951,709 | 4/1976 | Jacob | 156/643 |
| 4,203,800 | 5/1980 | Kitcher et al. | 156/652 |
| 4,478,678 | 10/1984 | Watnabe | 156/643 |
| 4,568,410 | 2/1986 | Thornquist | 156/643 |
| 4,637,129 | 1/1987 | Derkits, Jr. et al. | 156/643 |

OTHER PUBLICATIONS

"Blanket CVD Tungsten Interconnect for VLSI Devices," Metha et al., *1986 Proceedings 3rd International IEEE VLSI Multilevel Interconnection Conference*, Santa Clara, Calif., Jun. 9-10, 1986, pp. 418-435.

"Selective Dry Etching of Tungsten for VLSI Metallization," Burba et al., *Journal of the Electrochemical Society: LSP Solid State Science and Technology*, Oct. 1986, pp. 2113-2118.

*Primary Examiner*—Kenneth M. Schor
*Assistant Examiner*—Lori-Ann Johnson
*Attorney, Agent, or Firm*—Mark F. Chadurjian

[57] ABSTRACT

A method for anisotropically etching a thick tungsten layer atop a thin underlayer comprised of titanium nitride, by exposure to a gaseous plasma comprised of a binary mixture of chlorine gas and oxygen, wherein oxygen comprises approximately 25%-45% of the mixture by volume. This plasma provides a combination of high tungsten etch rate, highly uniform etching, anisotropic profiles, and high etch rate ratio to underlaying glass passivation layers.

9 Claims, 1 Drawing Sheet

ANISOTROPIC ETCH PROCESS FOR TUNGSTEN METALLURGY

BACKGROUND OF THE INVENTION

Cross Reference to Related Applications

Reference is made to co-pending U.S. patent application Ser. No. 031,808, entitled, "Composite Semiconductor Conductive Structures and Processes For Forming the Same," by J. E. Cronin et al, assigned to the assignee of the present invention. The application relates to various conductive structures that utilize an underlayer of titanium nitride and an overlayer of tungsten.

Technical Field

The present invention relates generally to the field of dry etching, and more specifically to methods of anisotropically patterning tungsten metallurgies.

Background Art

Until recently, aluminum and aluminum-based alloys have been the metallurgy of choice for the vast majority of semiconductor device applications. However, as the device densities of integrated circuits increase, there is a need to utilize metallurgies that can be conformally coated over the resulting steep topologies.

It has been found that the family of metals commonly referred to as the "refractory metals" (i.e. tungsten, titanium, molybdenum, cobalt, tantalum, nickel, etc.) can be conformally coated on substrates using low pressure chemical vapor deposition techniques (LPCVD). In these techniques, a refractory metal source gas (e.g. tungsten hexafluoride in the case of tungsten deposition) undergoes a series of reduction reactions so as to deposit a layer of refractory metal on the substrate.

One of the problems encountered when utilizing a refractory metal such as tungsten is that it exhibits poor adhesion to silicon oxide. It has been suggested that this problem can be addressed by incorporating a nucleation layer beneath the tungsten layer. In the above-referenced U.S. patent application Ser. No. 031,808 (the teachings of which are herein incorporated by reference), tungsten is coated on a titanium nitride underlayer. It has been found that the W/TiN combination presents good adhesion characteristics while also providing extremely low contact resistance. After deposition, the above layers must be anisotropically patterned in order to minimize surface area consumption.

An article by Metha et al, entitled "Blanket CVD Tungsten Interconnect for VLSI Devices," 1986 *Proceedings 3rd International IEEE VLSI Multilevel Interconnection Conference*, Santa Clara, Calif., June 9–10, 1986, pages 418–435, discloses the use of a ternary plasma gas chemistry comprised of $SF_6/CCl_4/O_2$ to anisotropically etch CVD tungsten. The authors noted that $SF_6$ alone produced poor etch anisotropy, which was remedied by adding $CCl_4$. Oxygen was added in order to enhance the etch selectivity to the underlying P-doped glass.

An article by Burba et al, entitled "Selective Dry Etching of Tungsten for VLSI Metallization," *Journal of the Electrochemical Society: LSP Solid State Science and Technology*, October 1986, pages 2113–2118, discloses a plurality of fluorocarbon-based tungsten etch gases. Specifically, the article compares the results achieved by gas combinations comprising $CF_4/O_2/He$, $CClF_3/O_2/He$ and $CBrF_3/O_2/He$. The results indicated that good anisotropy was only achieved by the $CBrF_3$-based etch gas.

U.S. Pat. No. 4,203,800 (issued May 20, 1982, to Kitcher Jr. et al and assigned to IBM) discloses a gas mixture for etching chromium, titanium or tungsten metallurgies. The mixture comprises 5–20% carbon tetrachloride ($CCl_4$) and 80–95% oxygen.

U.S. Pat. No. 4,478,678 (issued Oct. 23, 1984, to Watanabe and assigned to Toshiba) discloses a method of reactive ion etching molybdenum or molybdenum silicide in a plasma comprised of a binary mixture of chlorine gas and oxygen, wherein the oxygen flow rate is less than about 30% (preferably between 5% and 20%) of the total gas mixture. As shown in the front figure of the patent, the etch rate of photoresist is greater than that of molybdenum metal when the $O_2$ percentage in the composite $Cl_2/O_2$ plasma gas is greater than approximately 20%. Moreover, the etch rate of molybdenum decreases with increasing oxygen concentrations above approximately 10%.

U.S. Pat. No. 3,951,709 (issued Apr. 20, 1976 to Jacob and assigned to the LFE Corporation) discloses a plurality of plasma compositions that are useful to etch chromium or gold metallurgies. Among these etch compositions is a binary mixture of chlorine gas and oxygen, wherein oxygen comprises between 40–80% of the mixture.

There is a need in the art for an anisotropic plasma gas chemistry that provides a combination of high tungsten etch rate and high etch selectivity to underlaying glass layers. In the prior art, selectivity is enhanced at the expense of etch rate and/or anisotropy.

SUMMARY OF THE INVENTION

It is thus an object of the present invention to provide a plasma gas mixture that will anisotropically etch tungsten.

It is another object of the present invention to provide a plasma gas mixture that will anisotropically etch a conductive stack comprised of a thin underlayer and a thick vapor deposited tungsten metal layer.

These and other objects of the present invention are realized by providing a plasma gas mixture comprised of chlorine gas and oxygen wherein oxygen comprises approximately 25%–45% of the total gas mixture. It has been found that this mixture will etch the tungsten metal layer and the underlaying barrier layer at substantially the same high etch rate, while simultaneously providing a very high etch rate ratio to an underlaying dielectric layer such as BPSG.

BREIF DESCRIPTION OF THE DRAWING

Figure 2:
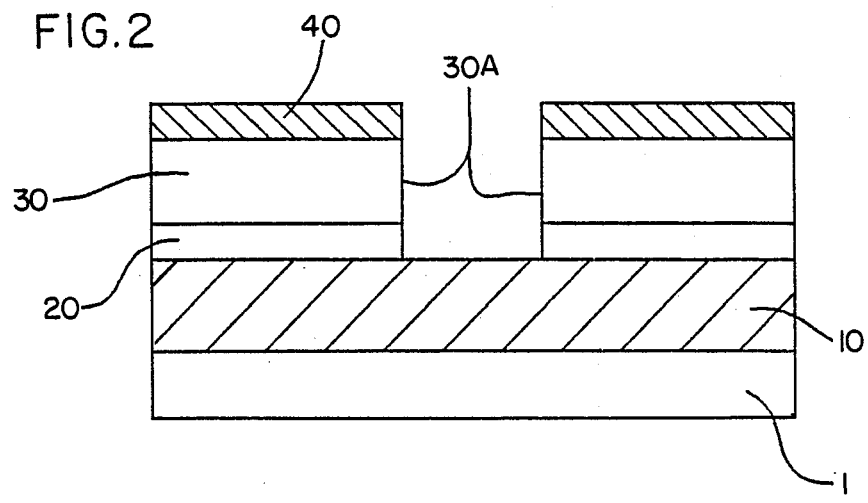
Figure 3:
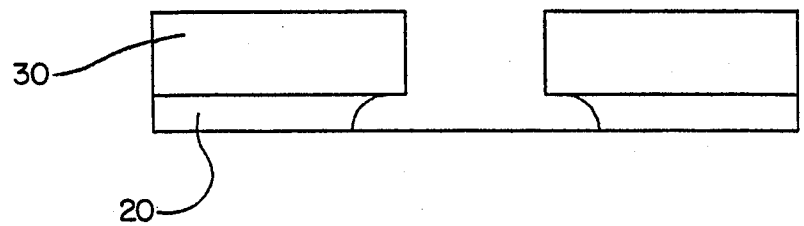

The foregoing and other features will become more apparent upon a description of the best mode for carrying out the invention as rendered below. In the description to follow, reference will be made to the accompanying drawing in which:

FIGS. 1–2 are cross-sectional views of a tungsten layer undergoing the etching process of the present invention; and FIG. 3 is a cross-sectional view illustrating the undercut problems exhibited by some of the prior art plasma gas chemistries.

DESCRIPTION OF THE BEST MODE FOR CARRYING OUT THE INVENTION

The etching process of the invention is schematically shown in the cross sectional views of FIGS. 1 and 2. As shown in FIG. 1, a dielectric layer 10 is disposed on a processed silicon substrate 1. Although the upper surface of substrate 1 is shown as being featureless, in practice transistors, capacitors and other integrated circuit elements are formed thereon. The dielectric 10 can be comprised of a spun-on glass such as boro-phososilicate glass (BPSG), phososilicate glass (PSG), a polymer such as polyimide, or any other conventional dielectric that is used for passivating the substrate 1. Then, as described in co-pending U.S. patent application Ser. No. 031,808 a thin (500–700 Å) underlayer 20 is formed on the dielectric 10. The underlayer 20 prevents the diffusion of fluorine specie into the underlaying layers during the deposition of the tungsten layer 30 as described below. This reduction in fluorine specie diffusion correspondingly increases the adhesion of the tungsten layer to the underlaying layers while also greatly reducing the contact resistance of the tungsten metal layer. In practice, as described in Ser. No. 031,808 it is preferred that layer 20 be comprised of titanium nitride. However, for the purposes of the present invention, layer 20 can also be comprised of other layers (e.g. titanium) for device applications in which low adhesion and/or high contact resistance can be tolerated. Titanium nitride can be formed by subjecting the upper surface of a sputtered or evaporated titanium layer to an anneal cycle in a $N_2$ or $NH_3$ ambient. Titanium nitride can also be formed directly by LPCVD or plasma enhanced CVD techniques.

Following the formation of underlayer 20, the tungsten layer 30 is deposited using LPCVD techniques. LPCVD tungsten is preferred for its ability to conformally cover steep topologies. That is, in practice the dielectric 10 will have apertures formed therein so that the tungsten layer forms a contact to underlaying device structures (e.g. diffusion regions, gate electrodes, etc.). As device dimensions decrease, these openings have smaller widths, and the ability to conformally coat these smaller openings with metal is extremely important.

In LPCVD of tungsten, tungsten hexafluoride ($WF_6$) undergoes a series of reduction reactions so as to provide a tungsten layer on the substrate. As a consequence of these reduction reactions, a large amount of fluorine is available for penetration into the underlaying layers. When titanium nitride is used as the underlayer, fluorine does not penetrate into the underlaying layers. When titanium is used as the underlayer, the peak fluorine content in the underlayer is approximately two times as great within the titanium layer as it is within the titanium nitride, and as a consequence some fluorine penetrates through the titanium into the underlaying layers. In either event, it appears that this fluorine penetration into the underlayer adversely affects the degree of anisotropy achieved by prior art etch process, as will be described below.

After the layer of tungsten 30 is deposited, a masking structure M is formed on the exposed surface of the tungsten layer. As shown in FIG. 1, the masking structure M preferably comprises a lower layer 40 of silicon oxide or silicon nitride, and an upper layer 50 comprised of a photosensitive polymer (i.e. photoresist). The lower dielectric layer 40 is incorporated for several reasons. In the $Cl_2/O_2$ plasma gas of the invention, photoresist is etched faster than the exposed tungsten layer. In other words, it is possible to totally remove an overlaying photoresist layer before the underlaying tungsten layer is completely etched. Dielectric layers such as silicon oxide and silicon nitride are etched more slowly in the $Cl_2/O_2$ plasma gas than is tungsten. Therefore, even if the upper layer of photoresist 50 is totally removed while the tungsten is being patterned, the underlaying dielectric layer 40 will preserve the masking pattern for the duration of the tungsten etch. Another reason that the lower dielectric layer 40 is used is that it provides a smooth surface for the overlaying photoresist. In general, CVD tungsten has a very rough upper surface. This is due to the nucleation and growth of the tungsten crystals. If a photoresist layer is directly deposited on the CVD tungsten, during optical exposure light will be scattered by the rough tungsten surface. The resulting photoresist image will be somewhat degraded. The underlaying dielectric layer 40 greatly reduces the light scattering affect of the roughened tungsten surface, thus enhancing the resulting photoresist image. This two layer masking structure M could be replaced by a single layer of photoresist. The thickness of this single photoresist layer must be large enough such that some photoresist remains at the completion of the etch cycle. Another option is to physically or chemically alter the upper surface of the photoresist so that it becomes more etch resistant.

After the overlaying photoresist 50 is exposed and developed using conventional techniques, the underlaying dielectric layer 40 is patterned without appreciably attacking the underlaying tungsten layer 30. For example, if layer 40 is comprised of silicon oxide, it could be patterned by exposure to a plasma gas comprised of $CF_4+O_2$, $NF_3+O_2$, or $CHF_3+O_2$. While this etchant would also attack the underlaying tungsten to a limited extent, the etch can be controlled so that the tungsten is not appreciably removed (e.g. by having less than 5% $O_2$ in the $CF_4/O_2$ mixture).

After the lower layer 40 has been patterned, the substrate is subjected to the $Cl_2/O_2$ binary plasma gas mixture of the invention. Specifically, the inventors have found that when oxygen comprises approximately 25%–45% of the total gas mixture by volume, the tungsten etch rate is maximized while also providing a high etch rate selectivity to the underlaying dielectric layer 10. For all runs, the plasma glow discharge was generated in a single wafer etch tool at an RF of 13.5 MHz. At an applied power of 400 W, the peak tungsten etch rate of 1850 Å/min is achieved when oxygen comprises approximately 40% of the total gas mixture. When the applied power is 300 W, the peak tungsten etch rate of 1440 Å/min is achieved when oxygen comprises approximately 30% of the total gas mixture. At both power level, the tungsten etch rate falls off with greater $O_2$ percentage (e.g. at 50% $O_2$, the tungsten etch rate is approximately 1560 Å/min at 400 W and 1180 Å/min at 300 W). It has also been found that for oxygen content greater than 20% (400 W), tungsten is etched more than 20 times faster than silicon oxide and at least 2.5 times faster than silicon nitride. At 25%–45% $O_2$, the silicon oxide etch rate is relatively constant; for silicon nitride, the etch rate decreases with increasing $O_2$ content. Of the gas mixtures reviewed, only the $Cl_2/O_2$ binary gas mixture of the invention provided a combination of high tungsten etch rate, high etch selectivity to silicon oxide, and an anisotropic etch profile. The anisotropic nature of the etch is shown in FIG. 2. The resulting sidewalls 30A are both substantially vertical (typically on the order of 82°-85° with respect to the horizontal) and continuous between the tungsten layer 30 and underlaying titanium nitride layer 20.

Experiments were conducted using other gas combinations. A variety of problems were encountered. For example, a plasma comprised of $CF_4/O_2$ produced a large degree of undercut in the underlaying barrier layer 20 at peripheral sections of the wafer. FIG. 3 shows an example of this undercut profile. In general, such a profile results when the etch rate of the barrier layer 20 is appreciably greater than that of the tungsten layer 30. It is postulated that this discontinuity in etch rate is produced by the fluorine content of the underlayer 20. The excess fluorine may add reactive specie in a localized manner, thus locally enhancing the etch rate of the underlayer. In essence this was a non-uniformity problem. While anisotropic etching was achieved at the center of the wafer, the standard deviation from the mean etch rate from the edge to the center of the wafer is typically on the order of 50-70% in the $CF_4/O_2$ plasmas. It should be noted that the observed uniformities may vary as between different etch tools at different parametric settings. The W etch rate was quite high (3000 Å). The observed standard deviation was on the order of 30% for the $SiF_4/O_2$ case. Moreover, it was found that this non-uniformity problem was presented in other fluorine based plasma gases (e.g. $SF_6/He/CHCl_3$). All of the above fluorine-based plasmas were found to have a low etch rate ratio to glass.

In general, switching to chlorine-based plasmas reduced the non-uniformity problem. That is, for most of the chlorine-based plasmas utilized, the standard deviation from the mean etch rate across the wafer was on the order of 10-20%. At the same time, in general the chlorine-based etch gases produced a lesser degree of undercut in the underlaying barrier layer. It is postulated that this may be due to the substitution of chlorine for fluorine as the major reactive specie source. However, the other chlorine-based chemistries provided a fairly low tungsten to BPSG etch rate ratio. Moreover, the maximum tungsten etch rate achieved by these chlorine-based plasmas was on the order of 600 angstroms per minute. It was found that only the chlorine/oxygen plasma gas mixture of the invention provided a combination of high tungsten to dielectric etch rate ratio (on the order of 20:1 for BPSG), high tungsten etch rate (on the order of 1800 angstroms per minute at 400 W), and no undercut.

The comparative results are summarized in Table 10 below:

It has been found that the parameters of the plasma gas of the invention are optimized when oxygen content is on the order of 25-45% of the total gas mixture. At an applied power of approximately 300-400 W, the maximum tungsten etch rate is generally achieved within this parameter range. Note that the maximum tungsten etch rate at 400 W (1800 Å/min) is three times greater than the maximum tungsten etch rate achieved by any of the chlorine-based gas combinations tested. The tungsten to BPSG etch rate ratio is on the order of 20:1 within this parameter range. Note that this etch selectivity is four times greater than the etch selectivity achieved by any of the other gas combinations tested. Therefore, the plasma gas combination of the invention presents the optimum tradeoff between high tungsten etch rate, high etch selectivity to glass, and high anisotropy.

EXAMPLE

The various layers are prepared in accordance with the example in co-pending U.S. patent application Ser. No. 031,808. The underlayer 20 is comprised of a 500 Å sputtered titanium layer, the upper 250 Å of which is converted into titanium nitride by annealing the titanium layer in a nitrogen atmosphere for 20 minutes at temperature 550° C. Then a 7000 Å LPCVD tungsten layer 30 is deposited on the barrier layer 20, and a 4000 Å silicon nitride layer 40 is deposited on the tungsten layer 30 by exposure to a $SiH_4+NH_3$ plasma at 375° C. A conventional photosensitive polymer 50 is deposited and patterned to expose selected regions of the nitride layer 40.

The nitride layer is then etched in a $CHF_3$ (75 SCCM)+$O_2$ (10 SCCM) plasma at 800 W for a time sufficient to remove the exposed portions of the nitride layer 40 without appreciably etching the underlaying tungsten layer 30. Then, both the underlaying tungsten layer 30 and the titanium nitride layer 20 are etched in a single wafer etch tool at a pressure of 90 mTorr and a power of 350 W (i.e., a power density on the order of 5 W/cm$^2$) in a plasma gas comprised of a 60:40 mixture of chlorine gas (20 SCCM) and oxygen (13 SCCM) for a time sufficient to produce an anisotropic etch profile as shown in FIG. 2. It has been found that such a procedure results in a sidewall slope of approximately 85°.

It is to be understood that while various modifications may be made to the teachings of the present invention, such modifications fall within the spirit and scope of the claimed invention. For example, while the process of the invention has been described as being carried out on single-wafer etch tools, experiments have indicated that the invention also has utility in batch etch tools.

We claim:

TABLE 1

| PARAMETER | $Cl_2 + O_2$ | $Cl_2 + Ar$ | $Cl_2 + CHCl_3$ | $SF_6 + He + CHCl_3$ | $BCl_3 + HCl + Cl_2$ | $CF_4 + O_2$ | $SiF_4 + O_2$ |
|---|---|---|---|---|---|---|---|
| ETCH TOOL (1) | SINGLE | SINGLE | SINGLE | BATCH (12) | BATCH (24) | SINGLE | SINGLE |
| W:RESIST E.R.R. | 0.7:1 | 0.7:1 | 0.7:1 | 1:1 | 0.5:1 | 2.5:1 | 2:1 |
| W:BPSG E.R.R. | 20:1 | 1:1 | 5:1 | 1.5:1 | 2:1 | 1:1 | 4:1 |
| UNIFORMITY (2) | ±15% | ±15% | ±15% | ±50% | ±15% | ±50-70% | ±30% |
| W ETCH RATE (A/MIN) | 1800 | 600 | 600 | 400 | 350 | 3000 | 900 |
| MASK NEEDED (3) | MLR | MLR | MLR | RESIST | THICK MLR | RESIST | RESIST |
| UNDERCUT | NONE | NONE | <0.1 μm | NONE | .1-.2 μm | <0.1 μm | .1-.2 μm |

(1) The above processes were carried out in commercially available single wafer tools ("single") or batch tools ("batch"). The $SF_6$ +He + $CHCl_3$ etch was carried out in a batch tool capable of etching 12 wafers at once; the $BCl_3$ + HCl + $Cl_2$ etch was carried out in a batch tool capable of etching 24 wafers at once.
(2) Uniformity is given in terms of the standard deviation from the mean etch rate. The standard deviation includes the difference in etch rate from the center to the edge of the wafer, as well as the difference in etch rate between successive wafers.
(3) In the case of a tungsten to resist etch rate ratio of less than one, a multi-level resist ("MLR") structure such as shown in FIG. 1 is preferred.

1. A method for anisotropically etching a layer of tunsten metal formed on an insulating layer disposed on a substrate, comprising the steps of:
   forming an insulating layer on a substrate, and etching said insulating layer to define apertures therethrough;
   forming a layer of tungsten metal on said insulating layer;
   placing said substrate into an etch chamber; and
   generating a gaseous plasma comprised of $Cl_2$ and oxygen, wherein oxygen comprises approximately 25%-45% of the binary mixture of $Cl_2$ and oxygen, said gaseous plasma etching said layer of tungsten metal without appreciably etching said insulating layer wherein the binary mixture is present in an amount sufficient to provide an active etching agent for the tungsten.

2. The method as recited in claim 1, wherein said chamber is held at a pressure below 100 mTorr and a power of approximately 300-400 W.

3. A method for anisotropically etching a tungsten layer overlying a conductive barrier layer disposed on an insulating layer arranged on a substrate, comprising the steps of:
   forming an insulating layer on a substrate, and etching said insulating layer to define apertures therethrough;
   forming a conductive barrier layer on said insulating layer and a tungsten layer on said conductive barrier layer;
   defining an inorganic masking layer on an exposed surface of said tungsten layer; and
   treating exposed portions of said tungsten layer and said conductive barrier layer in a plasma gas mixture comprised of $Cl_2$ and oxygen, wherein said oxygen comprises approximately 25%-45% of the binary gas mixture of $Cl_2$ and oxygen, so as to anisotropically etch both of said tungsten layer and said conductive barrier layer at high rates that are substantially uniform across the substrate, without substantially removing either of said insulating layer or said masking layer wherein the binary mixture is present in an amount sufficient to provide an active etching agent for the tungsten.

4. The method as recited in claim 3, wherein said insulating layer is selected from the group consisting of boro-phosphosilicate glass, phososilicate glass, and silicon dioxide.

5. The method as recited in claim 4, wherein said inorganic masking layer is selected from the group consisting of silicon oxide, silicon nitride, and mixtures thereof.

6. The method as recited in claim 5, wherein said inorganic masking layer is comprised of silicon nitride, and wherein selected portions of said silicon nitride are removed by exposure to a plasma gas mixture selected from the group consisting of $CHF_3$ and $O_2$, $CF_4$ and $O_2$, and $NF_3$ and $O_2$.

7. The method as recited in claim 6, wherein said tungsten layer and said conductive barrier layer are etched in a chamber held at a pressure of approximately 90 mTorr and a power of approximately 300-400 W.

8. A method for anisotropically etching a thick layer of tungsten disposed above a thin layer of titanium nitride disposed on a glass passivating layer arranged on a substrate, comprising the steps of:
   forming a glass passivating layer on a substrate, and etching said glass passivating layer to define apertures therethrough;
   forming a layer of titanium nitride on said glass passivating layer and a layer of tungsten on said layer of titanium nitride;
   forming an inorganic layer on an exposed surface of said tungsten layer;
   depositing a layer of photosensitive polymer on said inorganic layer;
   exposing and developing said layer of photosensitive polymer so as to expose selective portions of said inorganic layer;
   removing said exposed portions of said inorganic layer without appreciably removing underlaying portions of said tungsten layer; and
   exposing underlaying portions of said tungsten layer and said titanium nitride layer to a binary plasma gas mixture comprised of $Cl_2$ and oxygen wherein said oxygen comprises approximately 25%-45% of said mixture and wherein the binary mixture is present in an amount sufficient to provide an active etching agent for the tungsten.

9. A method for anisotropically etching a layer of tungsten disposed on a refractory metal-based barrier layer, comprising the steps of forming a refractory metal-based barrier layer on a substrate and a layer of tungsten on said refractory metal-based barrier layer, and exposing said layers to a plasma comprised of $Cl_2$ and oxygen, wherein said oxygen comprises approximately 25%-45% of the binary mixture of $Cl_2$ and oxygen, wherein the binary mixture is present in an amount sufficient to provide an active etching agent for the tungsten.

* * * * *